United States Patent [19]

Rathke et al.

[11] Patent Number: 5,304,935
[45] Date of Patent: Apr. 19, 1994

[54] LOAD DRIVER AND SYSTEM WITH FAULT DETECTION APPARATUS FOR PROVIDING A SEQUENCE OF FAULT DETECTION LOGIC STATES

[75] Inventors: William M. Rathke, Arlington Heights; Jean M. Villevieille, Palatine; William J. McGraw, Mundelein, all of Ill.

[73] Assignee: Motorola, Inc., Schaumburg, Ill.

[21] Appl. No.: 809,685

[22] Filed: Dec. 17, 1991

[51] Int. Cl.[5] ............................................ G01R 31/02
[52] U.S. Cl. .................................. 324/415; 324/418; 361/101; 340/644
[58] Field of Search ............. 324/415, 418; 73/119 A, 73/129; 361/93, 100, 101

[56] References Cited

U.S. PATENT DOCUMENTS

| 4,319,193 | 3/1982 | Boccali et al. | 324/418 |
| 4,736,267 | 4/1988 | Karlmann et al. | 361/101 |
| 4,918,564 | 4/1990 | Walker et al. | 361/101 X |
| 4,932,246 | 6/1990 | Deutsch et al. | 73/119 A |

OTHER PUBLICATIONS

Robert W. Deutsch, *Motorola Technical Developments*, vol. 3, "Injector Fault Testing Methods", Mar. 1983, pp. 47–52.

Primary Examiner—Gerard R. Strecker
Assistant Examiner—Diep Do
Attorney, Agent, or Firm—Phillip H. Melamed

[57] ABSTRACT

Load driver system (10) preferably uses a microprocessor controller (20) to generate write/read signals and command signals received by a circuit at write/read and command/status input terminals (16, 17). The circuit (15) responds to the input signals and controls a semiconductor switch (11) that controls the operative state of a load (14). The circuit (15) includes a load shorted high detector (28), a load shorted low detector (29) and a load open detector (30) which are used to detect various faults and provide a predetermined sequence of logic states at the command/status input terminal (17) during read cycles implemented by the controller (20). Thus one input line (terminal 17) is used to both send commands to the semiconductor switch (11) and receive a sequence of logic states indicative of various fault modes. This permits the controller to determine which of several types of faults, if any, has occurred, while minimizing the number of controller-circuit interconnections.

23 Claims, 5 Drawing Sheets

TYPICAL SWITCH CURRENT SENSOR

STATUS LINE FOR DIFFERENT SWITCH MODES AND FAULTS

| INTENDED SWITCH MODE | STATUS LINE NO FAULTS | STATUS LINE S.C. HIGH FAULT | STATUS LINE S.C. LOW FAULT | STATUS LINE OPEN CIRCUIT FAULT |
|---|---|---|---|---|
| ON | 0 | 1 | 0 | 0 |
| OFF/DURING FLYBACK | 0 | 1 | 0 | 1 |
| OFF/AFTER FLYBACK | 1 | 1 | 0 | 1 |

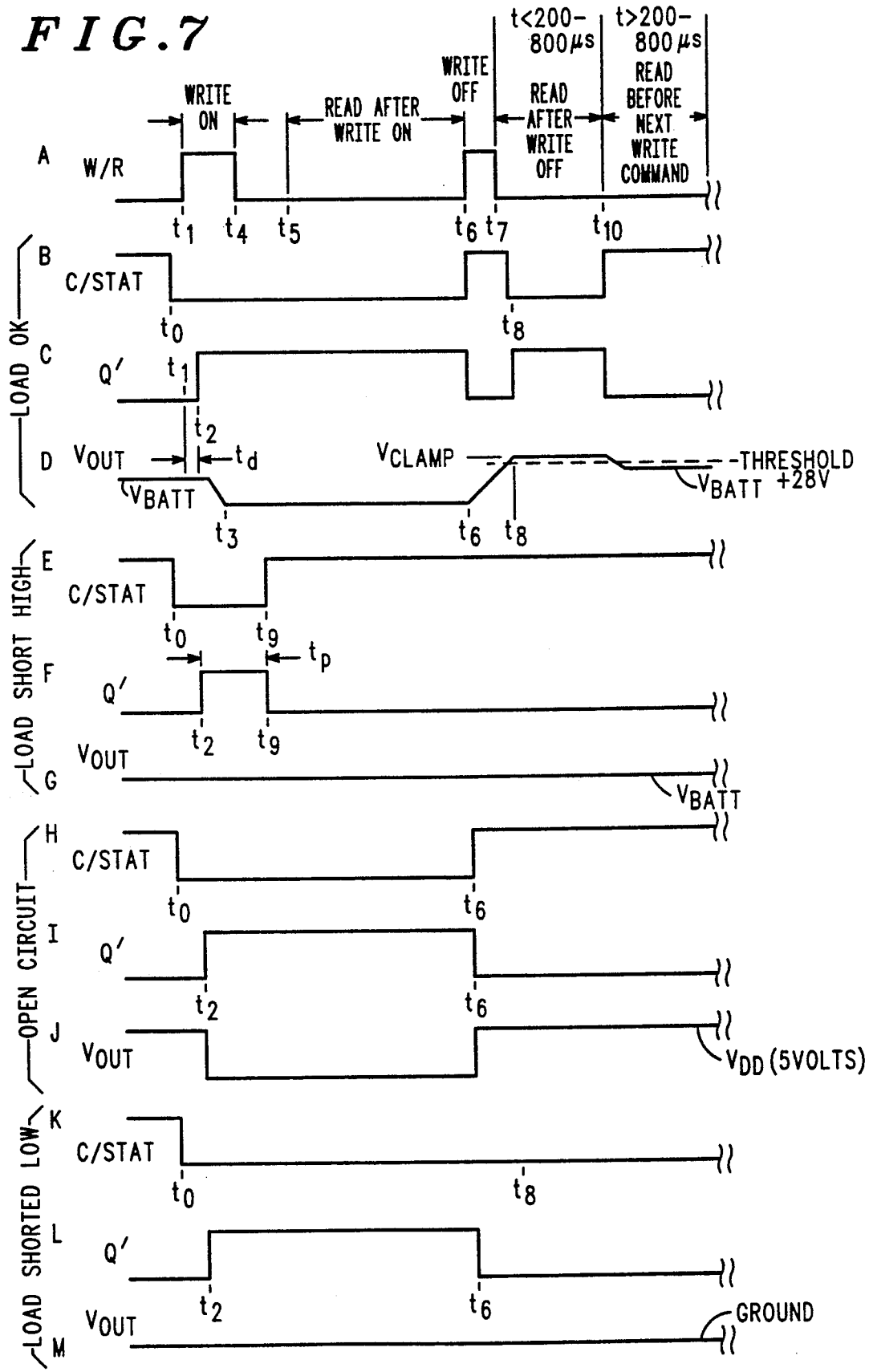

LOAD DRIVER AND SYSTEM WITH FAULT DETECTION APPARATUS FOR PROVIDING A SEQUENCE OF FAULT DETECTION LOGIC STATES

FIELD OF THE INVENTION

The present invention relates to the field of load drivers which have fault detection apparatus, and systems which utilize such load drivers to control the operation of a load.

BACKGROUND OF THE INVENTION

Load drivers are known in which a semiconductor switch receives control signals at a control electrode and has an output electrode connected to a load for control of the load. When the load is inductive, such as would be the case if the load is a relay in an anti-skid brake system, the load will provide a flyback or inductive kick voltage when load current is interrupted.

Some prior load driver systems have used a controller to determine, via a command line, the control signals provided to the control electrode of the semiconductor switch. Then, on the same command line, the controller monitors logic states which indicate the operation of the semiconductor switch and its load. This minimizes the number of lines connecting the controller and load driver. Typically, the output of the semiconductor switch is monitored when the switch is on and also when the switch is off. This provides a sequence of two logic states during the on and off states to be analyzed by the controller for diagnosing various types of faults. However, in some load driver systems it is imperative that a more complex and thorough diagnostic analysis of the operation of the semiconductor switch and load be implemented. For example, when the load comprises a relay device in an anti-skid brake system, it is important to know exactly what type of fault mode has occurred. For some types of fault modes a fail-safe or limp home mode can be implemented which still allows operation of the vehicle in which the anti-skid brake system is provided. However, for other types of faults of the anti-skid brake relay, the entire brake system must be deactivated because it is unreliable. Prior systems which use a common command/fault line have not been able to identify a large number of different faults.

Some systems utilize multiplexing to minimize the number of lines connecting a microprocessor controller and a plurality of load drivers. U.S. Pat. No. 4,932,246 to Deutsch et al. entitled, "Diagnostic Fault Test System and Circuit" illustrates such a system which also includes diagnostic fault testing apparatus. That system identifies a large number of faults, but it uses a fault sense line separate from the command control line. Systems which use a common command/fault line fail to adequately discriminate between various different types of fault conditions.

SUMMARY OF THE INVENTION

In one embodiment of the present invention a load driver with fault detection apparatus is provided. The load driver with fault detection apparatus comprises: a semiconductor switch having a control electrode for receiving a switch control signal which determines on and off modes of operation of the switch, the switch having an output electrode for connection to an associated electrical load; W/R terminal for receiving a write/read control signal; C/stat terminal for receiving a command signal; circuit means coupled between the semiconductor switch and the W/R and C/stat terminals for providing the switch control signal to the semiconductor switch in accordance with the write/read signal and the command signal; and fault diagnostic circuit means coupled to said semiconductor switch for monitoring operation of the semiconductor switch and its associated load and for providing, at said C/stat terminal, a timed sequence of at least three predetermined logic states indicative of the monitored switch/load operation, each of the predetermined logic states indicative of, respectively, switch load operation at sequential times (a) after said switch control signal attempts to turn said switch on, (b) at a first time after said switch control signal attempts to turn said semiconductor switch off, and (c) at a second time, later than said first time, after said switch control signal attempts to turn said semiconductor switch off, a particular sequence of said three logic states indicating proper switch/load operation and each of three other sequences of said three logic states indicative of a different operational fault of said switch/load.

A load driver system constructed in accordance with the above stated embodiment is also disclosed wherein the system includes an inductive load and, preferably, a microprocessor controller which generates the write/read control signal and command signal and also analyzes the sequence of the three predetermined logic states to determine the type of fault condition which may exist for the switch/load.

The above stated features, and other features of the present embodiment described herein, permit the use of a minimum number of conductor lines connecting a microprocessor controller to a semiconductor switch, which is acting as a load driver, while enabling the microprocessor controller to analyze a digital sequence of logic states to determine a large number of operative conditions of the load driver semiconductor switch and its associated load. Also a system is described which uses the above principles to provide N+1 lines to control and monitor N switches and their loads.

BRIEF DESCRIPTION OF THE DRAWINGS

The present invention can be better understood by reference to the drawings in which:

FIG. 7 is a graph showing a plurality of waveforms for various signals A-M provided by the system shown in FIG. 1.

DESCRIPTION OF THE PREFERRED EMBODIMENTS

Figure 1:
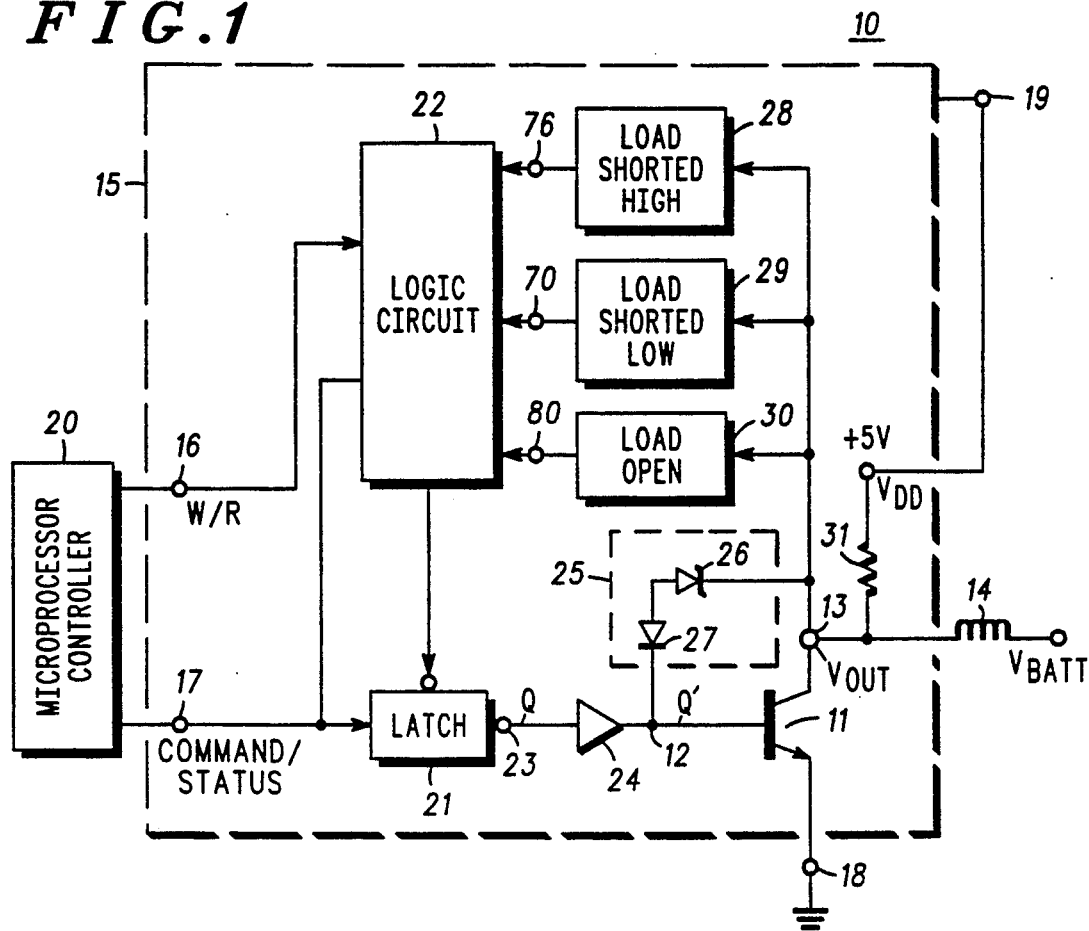
FIG. 1 is a schematic block diagram of a load driver system constructed in accordance with the present invention.

Referring to FIG. 1, a load driver system 10 with fault detection apparatus is illustrated. The system includes a semiconductor switch 11 which, while illustrated as a conventional NPN transistor, could also comprise a MOSFET transistor. The transistor 11 functions as a load driver and has a control electrode corresponding to a terminal 12 which receives a switch control signal which determines the on and off mode of the transistor 11. The transistor also has an output electrode corresponding to a terminal 13 at which an output signal $V_{OUT}$ is provided. The terminal 13 is connected through an inductive load 14 to a power supply voltage terminal $V_{BATT}$ at which a +12 volt battery voltage is provided. Preferably the load 14 comprises a vehicle electronic relay such as used in anti-skid brake systems wherein it is important to determine when the transistor 11 and load 14 fail to operate properly, and also to determine exactly what fault mode of operation may exist since very different types of corrective action may be desired for different types of faults.

The load driver system 10 includes a circuit 15 wherein the transistor 11 is within the circuit 15. A write/read (W/R) terminal 16 is provided as an input terminal of the circuit 15 and a command/status (C/stat) terminal 17 is provided as a bi-directional input and output terminal of the circuit 15. The circuit 15 also utilizes the terminal 13 as an output terminal and a ground output terminal 18 is provided along with a power supply input terminal 19 connected to the $V_{DD}$ terminal.

External to the circuit 15, which preferably will be implemented in at least partial integrated circuit form as a load driver power module, a microprocessor controller 20 is provided and will supply write/read signals to the terminal 16 and also command signals to the terminal 17. In addition, the microprocessor controller 20 will monitor predetermined logic states provided at the terminal 17 which indicate the status of the switch 11 and load 14. The controller 20 will thereby diagnose the type of faults which may exist for the semiconductor switch load driver 11 and load 14. Thus the microprocessor controller 20 will essentially implement a bi-directional communication of information via the terminal 17 since it will send command signals to the transistor 11 and receive predetermined logic state sequences from the circuit 15 via the terminal 17.

Within the circuit 15 is a latch 21 that receives signals from the terminal 17 and signals from a logic circuit 22. The latch 21 provides an output signal Q at a terminal 23 that is coupled through a non-inverting amplifier 24 to the terminal 12 as a signal Q'. The signal Q at the latch output terminal 23 represents a control signal generated in accordance with instructions from the microprocessor controller 20 that turns the transistor 11 on and off at appropriate times. In addition, an inductive clamp circuit 25 is provided between the terminals 13 and 12. The circuit 25 essentially comprises a zener diode 26 and a conventional diode 27 which implement clamping of the inductive kick or flyback voltage provided by the load 14 when the previously on transistor 11 is then turned off. The operation of the flyback clamp circuit 25 is conventional and well understood and results in limiting the flyback voltage to between 36 to 50 volts.

As shown in FIG. 1, the circuit 15 also includes a load shorted high detector 28, a load shorted low detector 29 and a load open detector 30. Each one of these detectors receives an input signal from the output terminal 13, and each one provides an input signal (at terminals 76, 70 and 80) to the logic circuit 22 which also receives an input signal from the write/read terminal 16. Essentially, the fault detectors 28 through 30 monitor the operation of the transistor 11 and load 14 and generate individual logic signals that are indicative of various types of faults which may occur. The logic circuit 22 effectively combines these fault indicative signals and provides them, at appropriate times, to the terminal 17 for monitoring by the microprocessor controller 20. In addition, the logic circuit 22 also responds to the write/read signals provided at the terminal 16 and provides an output to the latch 21. This output selectively enables the latch 21 to respond to command signals at the terminal 17 and then to ignore status signals provided at the terminal 17 which are predetermined sequences of logic states that indicate the type of fault which may have occurred in the operation of the transistor 11 and load 14. In addition to the above noted components, a 22K resistor 31 is illustrated in FIG. 1 as being connected between the terminal 13 and a low voltage power supply terminal $V_{DD}$ which is maintained at +5 volts. This resistor is utilized to ensure the ability of the system 10 to detect the absence of a flyback voltage at the terminal 13 and thereby determine if the load 14 is shorted to ground. A short to ground condition corresponds to a "load shorted low" condition. The manner in which this occurs will be subsequently described.

Figures 3, 4:
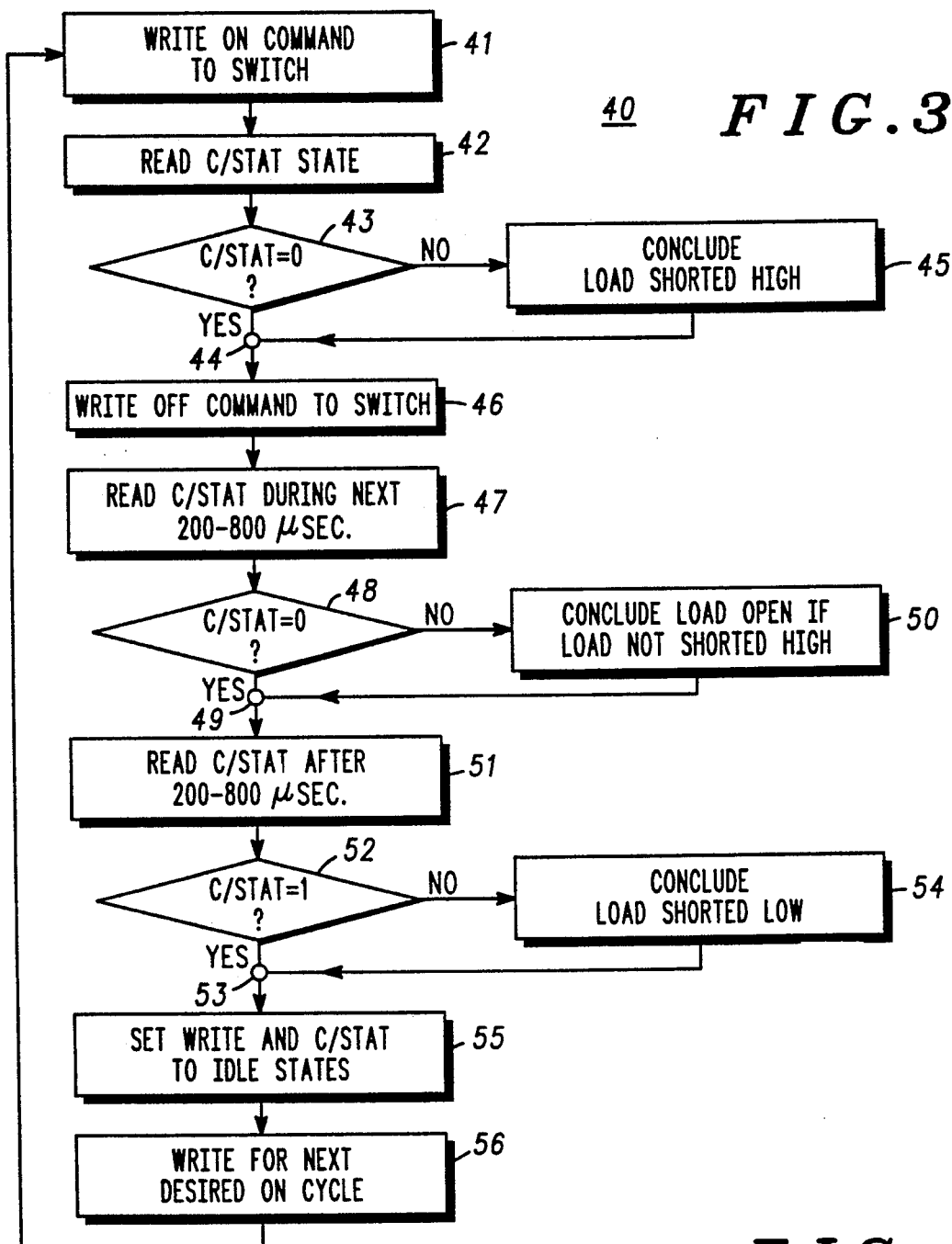
FIG. 3 is a general flowchart illustrating the operation of the system shown in FIG. 1.
FIG. 4 is chart illustrating logic state signals provided by the system shown in FIG. 1.

Referring now to FIG. 3, a flowchart 40 is illustrated which generally describes the overall operation of the system 10. At a step 41, the microprocessor controller 20 will write an on command to the semiconductor switch 11. This can occur by generating a low to high logic state transition at the W/R terminal 16 while a low logic command state is maintained by the controller 20 at the terminal 17. These two conditions, via the logic circuit 22 and latch 21, result in providing a turn on signal (signal Q' at terminal 12) to the transistor 11. The latch 21 maintains this turn on signal until either a turn off signal is provided by the controller 20 or a fault is detected which, via the logic circuit 22, will cancel this turn on condition, or mode, of the transistor 11.

After the step 41, a step 42 corresponds to the microprocessor controller 20 reading the logic state provided at the terminal 17 by the logic circuit 22. A decision block 43 inquires if this logic state is zero. If so, this corresponds to proper operation and control passes to a terminal 44. If not, the microprocessor controller, via a step 45, determines that the load 14 is shorted high which corresponds to the terminal 13 being directly connected to the power supply terminal $V_{BATT}$. Control then returns to terminal 44. After the terminal 44, control passes to a block 46 which corresponds to the microprocessor controller 20 writing an off command to the switch 11. This is achieved by the controller 20 providing simultaneous high logic states at the terminals 16 and 17. After this, a process block 47 corresponds to the controller 20 reading the logic state at the terminal 17 during the next time period which can last anywhere from 200 to 800 microseconds. A decision block 48 inquires if the read logic state at terminal 17 is zero or not. If it is zero, this again corresponds to proper operation of the switch 11 and load 14 and control passes to a terminal 49. If not, a process step 50 corresponds to the microprocessor controller making a load open determination if the load was not already identified as being shorted high. Then control passes to terminal 49. After the terminal 49, control passes to a process block 51 which reads the logic state at the terminal 17 after the 200–800 microsecond time period.

After the process block 51 a decision block 52 inquires if the logic state at the terminal 17 is now equal to one, instead of zero. If so, again this corresponds to proper operation and control passes to a terminal 53. If not, the microprocessor controller 20 determines that the load is shorted low, corresponding to the load output terminal 13 being connected to ground, via a process block 54. Control then passes to the terminal 53. From terminal 53 control passes to a process block 55 indicative to the controller 20 setting the write/read and C/stat logic states to an idle condition. Then a process block 56 essentially waits for the next desired cycle during which the controller 20 will turn the load driver semiconductor switch 11 on and then off.

Essentially, the flowchart 40 indicates that the system 10 sends an on signal to the switch 11 and then monitors the operation of the switch via the signal provided on the command/status terminal 17. Subsequently, the controller will tell the switch 11 to turn off and then during the next 200–800 microseconds it will monitor the signal at the terminal 17 to determine one type of fault and during a time period after the 200–800 microsecond period it will monitor the signal at the terminal 17 to determine if a different type of fault may exist. This type of operation is more clearly illustrated by the chart in FIG. 4.

FIG. 4 illustrates the status line (C/stat-terminal 17) logic states which are provided for different semiconductor switch 11 modes of operation and for different types of fault and no fault conditions which may occur with respect to the semiconductor switch 11 and the load 14. The chart in FIG. 4 illustrates the logic states of the signals at the terminal 17 during three different modes of operation of the semiconductor switch 11. During the first or on mode of operation, the controller 20 has attempted to turn the switch 11 on. After some initial time period, the logic state at the terminal 17 is read by the controller 20 to determine the effect of this command. Subsequently, the controller 20 will instruct the switch 11 to turn off and during a 200–800 microsecond time period after that, which will correspond to the time duration during which a flyback voltage is expected to be generated due to the inductive load 14, again the microprocessor controller will monitor the signal at the terminal 17. The actual time period which will be in the range of 200 to 800 microseconds will depend on the characteristics of the transistor 11 and load 14. After the 200–800 microsecond time, the controller 20 will again monitor the signal at the terminal 17 since during this time a definite off mode for the semiconductor switch 11 should exist since by this time the flyback voltage from the load 14 has been dissipated.

The chart in FIG. 4 illustrates that for the on, off during flyback and off after flyback modes, proper operation of the switch 11 and load 14 is indicated by the three logic state sequence of zero, zero and one being provided at the terminal 17. Three other sequences of logic states are also illustrated in FIG. 4 and are identified with three different types of faulty operation corresponding to a short circuit high fault (SC high fault), a short circuit low fault (SC low fault) and an open circuit fault. The microprocessor controller 20 analyzes the logic states provided at the terminal 17 to determine which one of the four different sequences of logic states has been provided. In this manner the controller 20 can determine if the switch 11 and load 14 are operating properly and it can determine, if a fault has occurred, which one of three different types of faults has occurred. All of this is accomplished through the bi-directional use of the single command and status terminal 17 which thereby minimizes the number of connections needed between the microprocessor controller and the circuit 15 containing the load driver semiconductor switch 11. Actually, the system 10 described herein not only detects faults of the switch 11 and load 14, but will also detect as a load/switch fault improper operation of the fault monitoring apparatus which includes the load shorted high, load shorted low and open circuit detectors 28, 29 and 30.

Figure 5:
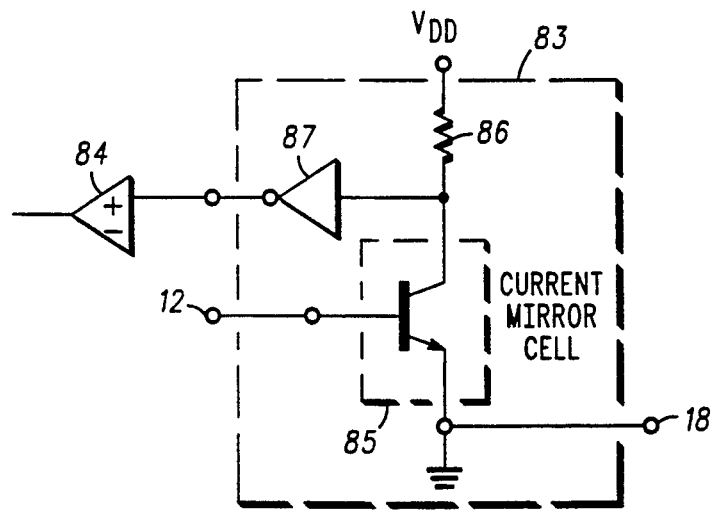
FIG. 5 is a schematic diagram of a block component shown in FIG. 2.
Figure 6:
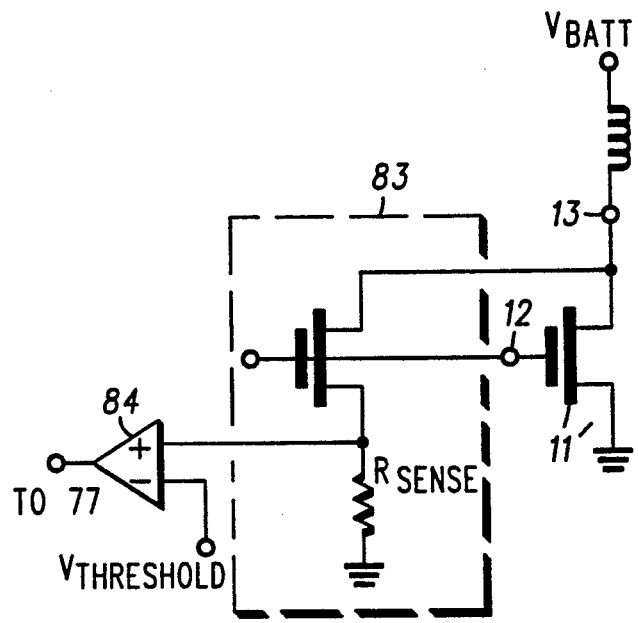
FIG. 6 is a schematic diagram of an alternate embodiment for the component shown in FIG. 5.

The manner in which the system 10 responds to the write/read signals at the terminal 16 and command signals at the terminal 17 and provides the four desired three logic states sequences, shown in the chart in FIG. 4, at the terminal 17 will now be explained in connection with the detailed schematic diagrams shown in FIGS. 2, 5 and 6 and the waveform diagrams shown in FIG. 7. Wherever identical components are illustrated in several of the FIGS., an identical reference number is utilized.

Figure 2:
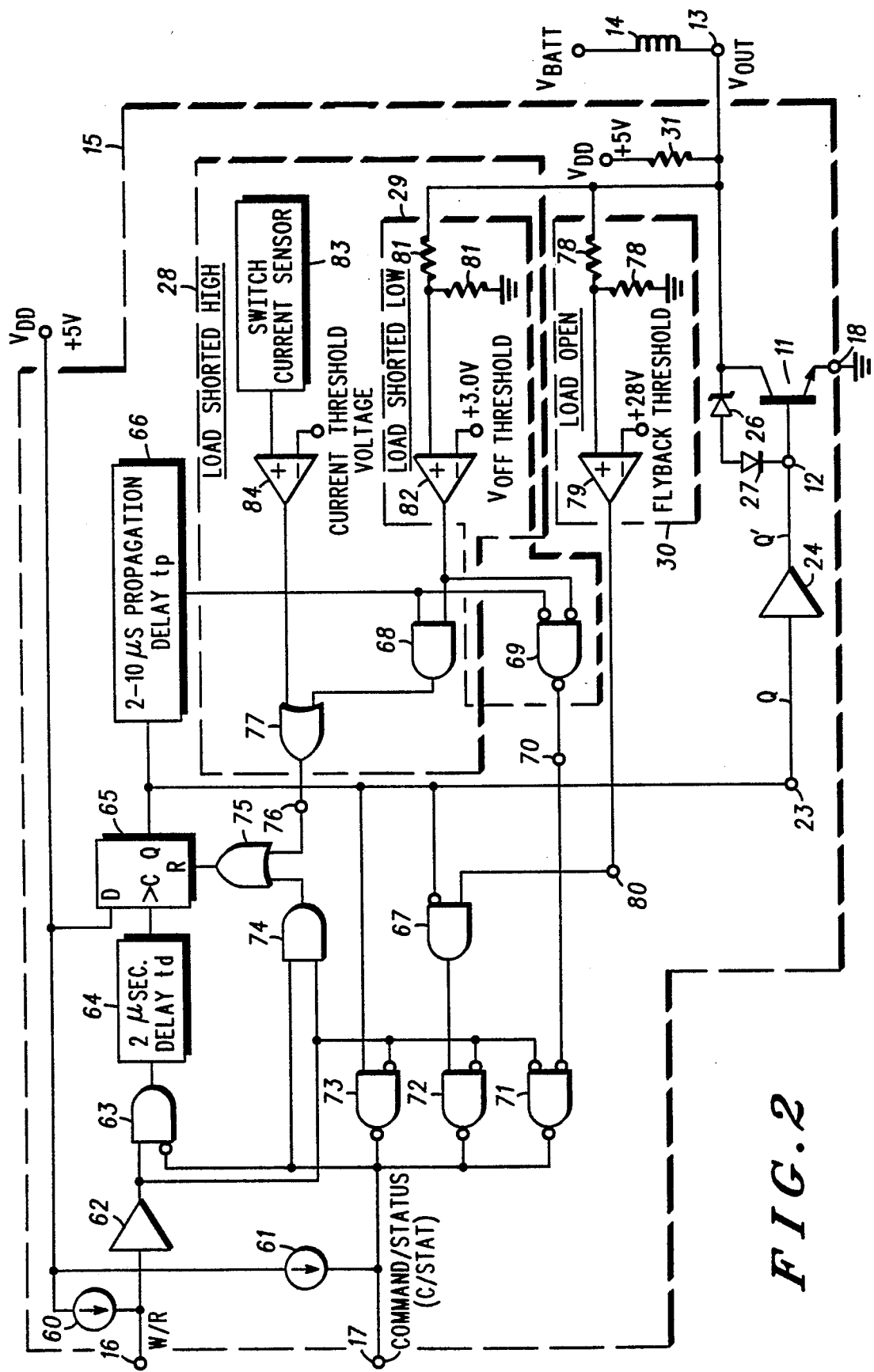
FIG. 2 is a more detailed schematic diagram illustrating portions of the system shown in FIG. 1.

Referring to FIG. 2, a more detailed schematic diagram illustrating a typical construction for the circuit 15 is illustrated. The low voltage $V_{DD}$ +5 volt power supply terminal is connected through current sources 60 and 61 to the terminals 16 and 17, respectively. The W/R terminal 16 is coupled through a non-inverting amplifier 62 as an input to a logic gate 63 that provides an output to a 2 microsecond delay circuit 64 implementing a delay of $t_d$. The delay circuit 64 provides noise immunity for the system 10 since it functions as a low pass filter and therefore fails to pass short duration high logic state transients. Thus only when a high logic of sufficient duration is provided as an input will the delay circuit 64 provide a high logic state output.

The output of circuit 64 provides a clock input to a D type flip-flop 65 that acts as a latch circuit corresponding to the latch 21. The data terminal D of the flip-flop 65 is connected to the terminal $V_{DD}$. An output terminal Q of the flip-flop, which terminal corresponds to the terminal 23, is connected as an input to a 2 to 10 microsecond propagation delay circuit 66 and as an input to AND type gates 67 and 73. An output of the delay circuit 66, which implements a propagation delay designated as $t_p$, is provided as an input to an AND gate 68 and as an input to a NAND gate 69. The output of NAND gate 69 is provided at a terminal 70 that is connected as an input to a NAND gate 71. The output of the AND type gate 67 is connected as a non-inverted input to an AND type gate 72. An AND type gate 73 has an input connected to the terminal 23 and provides its output to the terminal 17 with the gates 71 and 72 also providing their outputs to terminal 17. Terminal 17 is also provided as input to an AND gate 74 and to an inverted input of the gate 63. The output of the non-inverting amplifier 62 is also provided to an inverting input of each of the gates 71 through 73 and to a non-inverting input of the gate 74. The output of the gate 74 is provided as an input to an OR gate 75 whose output is connected to a reset terminal R of the flip-flop 65. Another input to the OR gate 75 is provided from a terminal 76 that corresponds to the output of an OR gate 77. The components 60-65, 67 and 71-75 generally comprise the logic circuit 22.

The load open detector 30, as shown in FIG. 2, is connected to the terminal 13 which provides, via a resistor divider 78 provided for input adjustment, an input to a positive terminal of a comparator 79 that receives a 28 volt flyback threshold voltage at its negative input terminal. An output of the comparator 79 is provided at a terminal 80 which is connected to a non-inverted input of the AND type gate 67. Essentially, the load open detector 30 functions to provide a high logic state at the terminal 80 in response to the existence of a flyback voltage produced at the terminal 13 which will exceed the 28 volt flyback threshold provided to the negative input of the comparator 79. The failure to provide a high logic state at the terminal 80 during the time during which a flyback voltage should be provided at the terminal 13, assuming that a load shorted low condition is not in existence, will result in creating a high logic state at the terminal 17 indicative of one of two possible failure modes, one corresponding to the open circuit fault. This can be seen by analysis of the logic states provided in FIG. 4. If a load shorted high condition was not detected by the controller 20, at step 45 in FIG. 3, when transistor 11 was suppose to be on, then the controller 20 will conclude an open circuit exists.

Also shown in FIG. 2 is a typical embodiment for the load shorted low detector 29. The detector 29 comprises a voltage divider 81 for scaling the voltage at the terminal 13 to an appropriate level for feeding into the positive input of a comparator 82 which receives a negative input from a positive 3 volt $V_{off}$ threshold. The output of the comparator 82 is provided as a non-inverting input to the AND gate 68 and provided as an input to the NAND gate 69. The NAND gate 69 provides at the terminal 70 a logic state which is indicative of a load shorted low condition being detected by the fault detector 29. Essentially, the detector 29 provides logic states at the terminal 70 which indicate if the voltage at the $V_{OUT}$ terminal 13 ever gets below 3 volts after the flyback occurrence time of 200-800 microseconds after turning transistor 11 off. This is therefore indicative of a load shorted low condition.

As illustrated in FIG. 2, the load shorted high detector 28 includes all of the load shorted low detector 29 except the NAND gate 69. The detector 28 also includes a switch current sensor 83 that provides an input to the positive input terminal of a comparator 84 which receives its negative input from a current threshold voltage terminal. The comparator 84 provides one input to the OR gate 77 which receives its other input from the output of the AND gate 68.

Essentially, the switch current sensor 83 monitors the current through the switch device 11 and provides a signal at the positive input of the comparator 84 which is indicative of the magnitude of the current through the switch 11. FIGS. 5 and 6 illustrate typical embodiments for such a switch current sensor 83. In FIG. 5, sensor 83 uses a current mirror cell 85 that represents a one or more cell semiconductor device in parallel with the multi-cell much larger semiconductor device 11 so as to form a current mirror. In this type of configuration, the current mirror cell 85 comprises just a few cell transistor identical to the much larger multi-cell transistor 11 with the control (or base) and emitter electrodes of the mirror cell held at identical potentials as the transistor 11 base and emitter electrodes. A resistor 86 connects the collector electrode of the current mirror cell to the low voltage power supply terminal $V_{DD}$. The collector is also connected to the input of an inverting amplifier 87. The amplifier 87 provides an output which is directed to the positive terminal of comparator 84. FIG. 6 illustrates an equivalent MOSFET configuration for the sensor 83 assuming the transistor 11 is a MOSFET transistor.

Essentially, the switch current sensor 83 just monitors the current through the switch 11 and develops a voltage related to this current. The exact same function could be achieved through the use of a current sensing resistor provided between the emitter of the transistor 11 and ground potential. In either case, the function provided by the sensor 83 and comparator 84 is to provide a high logic state as an input to the OR gate 77 when current through the transistor 11 is above some maximum current threshold determined by the current threshold voltage provided at the negative input of the comparator 84.

In response to excessive current being drawn through the transistor 11, which may be indicative of a load shorted high condition, the OR gate 77 will provide a high logic state to the terminal 76 that results in resetting the flip-flop 65. Therefore, when excessive current is sensed in the transistor 11 the signal Q at the terminal 23 will be forced low turning off the transistor at a time during which the microprocessor controller 20 had instructed the transistor 11 to turn and remain on. The low signal provided by the flip-flop 65 at the terminal 23 will also result in a high logic state at the terminal 17. This high logic state will be read by the microprocessor controller 20 during the time the transistor 11 is supposed to be on. This will thereby indicate a short circuit high fault for the system.

It should be noted that besides the load shorted high circuit 28 indicating a shorted high fault when actual current through the transistor 11 is excessive, the load shorted high detector 28 also utilizes the load shorted low detector 29 as a desaturation detector for the transistor 11. If the transistor 11 is not saturated, as it normally should be in its on state, an excessive voltage in excess of 3 volts will exist across this transistor between the terminals 13 and 18. The load shorted low detector 29 monitors this voltage, and therefore its output is also utilized to determine a load shorted high condition which resulted in excessive voltage across the transistor during its on state. Thus the load shorted high detector 28 essentially ORs these two detections by the use of the OR gate 77. In response to either detecting excessive current through the transistor or detecting a lack of saturation of the transistor (desaturation detection) during a desired transistor on state, a logic state is provided at the terminal 76 to turn the transistor off and create an appropriate high logic state at the terminal 17.

The operation of the system 10 and the manner in which the circuitry in FIG. 2 achieves this operation can be better understood by reference to the signal waveforms in FIG. 7.

Referring to FIG. 7, a signal A represents the write/-read signal provided at the terminal 16 by the microprocessor controller 20. This signal is not a bidirectional signal and is provided by the microprocessor controller 20 to the terminal 16. The signal A illustrates that at a time $t_1$ the controller 20 will implement a low to high logic state transition for the signal at the terminal 16 and this high logic state will remain until a subsequent time $t_4$. This corresponds to a write on mode. The signal B in FIG. 7 illustrates the logic states provided at the command/status terminal 17 by the controller 20 and also by the circuit 15 for proper operation of the transistor 11 and load 14 assuming a no fault condition. Signals C and D in FIG. 7 correspond to the signals Q' and $V_{OUT}$ at terminals 12 and 13, respectively, also assuming proper switch and load operation.

Signal B illustrates that at a prior time $t_0$ the controller 20 has forced the logic state at the terminal 17 to a low logic state if necessary. This low logic state is maintained until at least a subsequent time $t_5$ by the controller 20. At the time $t_5$ the controller 20 will release its controlling hold of the logic state at the terminal 17 and allow the circuit 15 to determine the logic states at this terminal. The time from $t_5$ to a time $t_6$ is referred to as the read cycle after write on for the microprocessor controller 20. During this time the controller 20 will now read the logic state at the terminal 17.

In response to the low to high transition of the signal A, after the delay time $t_d$, the flip-flop 65 will provide a high output logic state at terminal 23. The same logic state is provided at the terminal 12, due to the amplifier 24, and is indicated by the signal C in FIG. 7 which is representative of the signal Q' provided at the terminal 12. Q' will therefore go high at a time $t_2$ which is after the time $t_1$ by virtue of the delay time $t_d$. The high state of the signal of Q' results in turning the switch 11 on. The signal D in FIG. 7 indicates the resultant effect since signal D corresponds to the signal $V_{OUT}$ at the terminal 13. After $t_2$ the $V_{OUT}$ signal gradually decreases from battery voltage to almost ground voltage (the saturation voltage of transistor 11) at a subsequent time $t_3$. These conditions are maintained until the time $t_6$ at which time the controller 20 will again write a signal to the switch 11, but now the switch 11 will be written an off command signal.

At the time $t_6$, the signal A will again implement a low to high transition and the high state will be maintained until a subsequent time $t_7$. When the controller 20 implements a write off cycle by virtue of the signal A between the times $t_6$ and $t_7$ being high, the controller 20 will also implement a high logic state at the terminal 17 for some predetermined period of time. This will result in resetting the flip-flop 65 such that a low state is provided for the signals Q and the Q' as illustrated in signal C in FIG. 7. This will turn off transistor 11. The turning off of the transistor 11 will then result in a rapid increase in the signal voltage $V_{OUT}$ (signal D) at the terminal 13 due to the inductive flyback provided by the load 14. This voltage increase will continue until a subsequent time $t_8$ at which the voltage at the terminal 13 will exceed the breakdown voltage of the zener diode 26 plus the forward bias voltage of diode 27 and transistor 11. These components will implement a 36 to 50 volt clamping threshold ($V_{CLAMP}$) for the voltage at the terminal 13. This clamping threshold voltage will be maintained at terminal 13 until the energy of the flyback pulse is dissipated. This clamping is implemented by turning the transistor 11 on so as to dissipate the flyback energy in a conventional manner. The turning of the transistor 11 back on occurs at the time $t_8$ at which time the breakdown voltage of the zener diode 26, the forward bias voltage of the diode 27, and the base-emitter turn on bias of transistor 11 is exceeded by the voltage at the terminal 13.

Prior to the time $t_8$, the voltage $V_{OUT}$ at the terminal 13 will have exceeded a 28 volt threshold provided as an input to the comparator 79 resulting in the terminal 80 now having a high logic state. The logic state at the terminal 80 is indicative of the occurrence of a flyback voltage. The logic gates in FIG. 2 react to this detected flyback voltage and provide a zero logic state at terminal 17 during the time period when the controller 20 will read the logic state at the terminal 17 during times $t_7$ to $t_{10}$. It should be noted that the write off high logic state provided for the signal A terminates at a time $t_7$ slightly prior to the occurrence of the time $t_8$. The time $t_7$ is programmed into the controller 20 so that it will occur prior to the expected time that flyback voltages, if they exist, will cause the voltage $V_{OUT}$ to exceed the breakdown of the zener diode 26 and turn on the transistor 11. After a time 10, the flyback energy is dissipated and the transistor 11 turns back off and the logic state at terminal 17 goes high. Between the times $t_7$ and $t_{10}$ the controller 20 reads the logic state at terminal 17 (signal B), and the controller also reads this logic state after time $t_{10}$.

The end result is that for proper operation of the switch 11 and load 14 the FIG. 7 signals A, B, C and D are generated resulting in the predetermined logic states shown in FIG. 4, under the vertical no fault column, being read by the controller 20. These logic states were provided at the terminal 17 during the appropriate read cycles of the microprocessor 20. The existence of the predetermined sequence of logic states shown in FIG. 4 under the no fault column indicates proper operation of the switch 11 and load 14.

It should be noted that the signal C in FIG. 7 represents in digital form the on-off state of the switch 11 based on the base (gate) control signal Q' at terminal 12. It does not, for purposes of clarity, show that actual analog variation of Q'. The same is true for the FIG. 7 signals F, I and L.

What has been explained so far with regard to FIG. 7 are the signals A, B, C and D which appear during proper no fault operation of the load driver switch 11 and load 14. The load driver system 10 will also detect any one of three fault conditions by the controller 20 analyzing the signals at the terminal 17 during the read cycles of the microprocessor controller 20. This occurs by virtue of the controller providing the same write/read signal A. However, now, depending on which fault exists, the signals at the terminal 17, the control terminal 12 and the output terminal 13 will be different and this is illustrated by the other signals shown in FIG. 7.

The signals E, F and G in FIG. 7 illustrate the signals which exist at the terminals 17, 12 and 13 in case of a load short high fault. These signals illustrate that again the transistor 11 is instructed to turn on by the microprocessor controller and a turn on logic state is provided at the control terminal 12 at circuit high fault as opposed to normal operation or a short circuit low fault or an open circuit fault.

The signals H, I and J in FIG. 7 illustrate the signals provided at the terminals 17, 12 and 13, respectively, for an open circuit fault. The signals K, L, and M in FIG. 7 illustrate the signals provided at the terminals 17, 12 and 13 in the event of load short low fault. Each of these two types of faults has its own predetermined sequence of logic states which are provided at the terminal 17 and read by the controller 20 during the appropriate read cycles of the controller. These read cycles exist between the times $t_5$ and $t_6$, $t_7$ and $t_{10}$ and after $t_{10}$. The resultant logic sequences are shown in FIG. 4.

What has been described above comprises a load driver system in which a sequence of three logic states provided at a single terminal (17) can identify either normal operation of the switch 11 and load 14 or any one of three different faults. Thus the microprocessor controller 20 can, by identifying what fault occurred, take appropriate action with regard to controlling the switch 11 and load 14 so as to avoid any catastrophic failure and implement a limp home or other type of moderate recovery, if possible. All this has been accomplished without providing separate on/off command and monitoring lines which monitoring lines must be interrogated by the microprocessor controller to determine what type of fault has existed. Only a single common command and monitor line is required comprising the bi-directional information line including the terminal 17.

The signals in FIG. 7 illustrate a write on command being sent to the switch 11 by the controller 20 the time $t_2$. However, because the load is shorted high, meaning that the terminal 13 is now directly connected to the $V_{BATT}$ terminal, the $V_{OUT}$ voltage at the terminal 13 will not decrease as would normally be the case. Because an excessive voltage is provided at the terminal 13 while the transistor 11 is on, the load shorted high detector 28 will detect this condition because either the transistor 11 will not be saturated or because excessive current will be sensed in the transistor 11. In either case, the load shorted high detector 28 will provide a high logic state at the terminal 76 resulting in turning off the transistor 11 at a subsequent time $t_9$ which will be prior to the time $t_5$ during which the microprocessor 20 will read the logic state at the terminal 17. In response to the turning off of the transistor 11 at the time $t_9$, a high logic state will now be provided at the terminal 17 due to the action of the various logic gates in the circuit 15. This high logic state will be the state read by the microprocessor controller 20 between the times $t_5$ and $t_6$. Thus, instead of a low logic state being found during this read time by the controller 20, a high logic state will exist. Similarly, since there will be no flyback voltage generated after the time $t_7$ until the subsequent time $t_{10}$, the controller 20 will read a high logic state between times $t_7$ and $t_{10}$. During normal operation between the times $t_7$ and $t_{10}$ a low logic state is provided at the terminal 17 due to the presence of a flyback voltage. After the time $t_{10}$, during a second read cycle by the controller 11 which occurs after $t_{10}$, again a high logic state is provided at the terminal 17. The end result is implementing the second vertical column in FIG. 4 with regard to logic states provided at the terminal 17 and read by the controller 20 during the various read cycles of the controller. This specific sequence of logic states is characteristic of a short implementing a low to high transition of the write/read signal at the terminal 16 while the command signal at the terminal 17 is maintained low by the controller. However, a write on command will also be generated by the circuitry in FIG. 2 in response to maintaining the logic state at the W/R terminal 16 high (a logic 1) while switching the logic state at the C/stat terminal 17 from high to low. This alternative operation is not illustrated in FIG. 7 but will create the same end result. The controller 20 can be programmed to function in this manner if desired.

Figure 8:
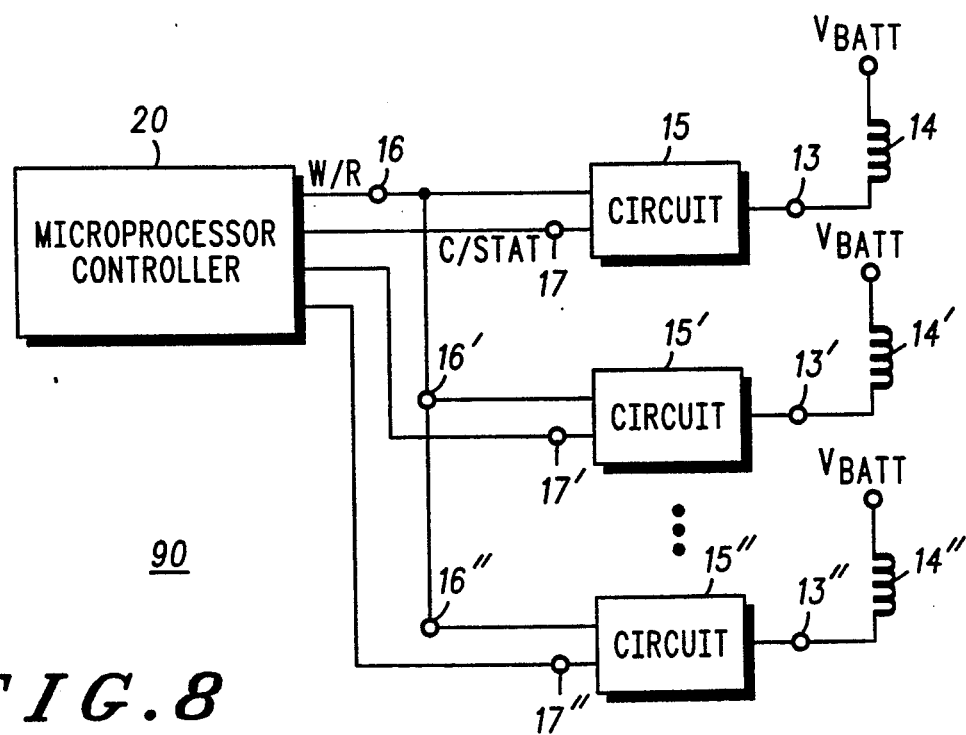
FIG. 8 is a schematic diagram of load driver system for a plurality of loads.

Referring to FIG. 8, a system 90 for a plurality of loads (14, 14', 14") is shown in which a single microprocessor, microprocessor 20, provides a single write/read signal and a plurality of command signals at a plurality of C/stat terminals. The microprocessor then monitors the operation of each of a plurality of switch/load pairs in a manner identical to that described above. Essentially the system 90 illustrates expanding the system 10 to control and monitor a plurality of N switch/load pairs by using N C/stat terminals and one common write/read line for a total of N+1 connect lines. This is achieved without using complex command decoders in the circuit 15 and without requiring the microprocessor to send complex coded on/off commands on the C/stat lines since the W/R line determines the write and read modes for the system.

While we have shown and described specific embodiments of this invention, further modifications and improvements will occur to those skilled in the art. All such modifications which retain the basic underlying principles disclosed and claimed herein are within the scope of this invention.

We claim:

1. Load driver with fault detection apparatus, comprising: semiconductor switch having a control electrode for receiving a switch control signal which determines on and off modes of operation of the switch, said switch having an output electrode for connection to an associated electrical load;

W/R terminal for receiving a write/read control signal;

C/stat terminal for receiving a command signal;

circuit means coupled between said semiconductor switch and said W/R and C/stat terminals for providing said switch control signal to said semiconductor switch in accordance with said write/read signal and said command signal; and fault diagnostic circuit means coupled to said semiconductor switch and at least one of said W/R and C/stat terminals for monitoring operation of said semiconductor switch and its associated load and for providing, at said one terminal, a timed sequence of at least three predetermined logic states indicative of said monitored switch/load operation, each of said predetermined logic states indicative of, respectively, switch/load operation at sequential times (a) after said switch control signal attempts to turn said switch on and when said switch is supposed to be on, (b) at a first time after said switch control signal attempts to turn said semiconductor switch off, and (c) at a second time when said switch is supposed to be off, later than said first time, after said switch control signal attempts to turn said semiconductor switch off, a particular sequence of said three logic states indicating proper switch/load operation and each of three other sequences of said three logic states indicative of a different operational fault of said switch/load.

2. Apparatus according to claim 1 wherein said circuit means provides said switch control signal with a switch on logic state to turn said switch on in response to the occurrence of a predetermined logic state condition of said write/read signal and a predetermined command on logic state of said command signal.

3. Apparatus according to claim 2 wherein said circuit means provides said switch control signal with a switch off logic state to turn said switch off in response to a predetermined logic state condition of said write/read signal and a predetermined command off logic state of said command signal which differs from said predetermined command on logic state.

4. Apparatus according to claim 2 wherein said circuit means includes a latch means for responding to said write/read signal and said command signal, and wherein said predetermined logic state condition of said write/read signal comprises a logic state transition of said write/read signal of a predetermined polarity.

5. Apparatus according to claim 1 wherein said fault diagnostic means includes fault detector means for providing said sequence of three logic states at said C/stat terminal by monitoring current through said switch and voltage at said switch output electrode.

6. Apparatus according to claim 5 wherein said fault detector means includes a load shorted high detector for providing as one of said logic three logic states a S.C. high fault logic state at said C/stat terminal in response to detecting, during said time (a), excessive current through said semiconductor switch after said semiconductor switch receives a switch on logic state signal at its control electrode and prior to said semiconductor switch receiving a switch off logic state signal at its control electrode.

7. Apparatus according to claim 6 wherein said load shorted high detector also includes circuitry for providing said S.C. high logic state in response to sensing an excessive voltage across said semiconductor switch when said switch is on.

8. Apparatus according to claim 6 wherein said fault detector means also includes a flyback voltage detector for determining said predetermined logic state at said C/stat terminal during said time (b) in response to comparing voltage at said semiconductor switch output electrode to a first high predetermined threshold voltage.

9. Apparatus according to claim 8 wherein said fault detector means includes a low voltage detector for determining said predetermined logic state at said C/stat terminal during said time (c) in response to comparing voltage at said semiconductor switch output electrode to a second low predetermined voltage threshold substantially below said first predetermined threshold.

10. Apparatus according to claim 5 wherein said fault detector means includes a flyback voltage detector for determining said predetermined logic state at said C/stat terminal during said time (b) in response to comparing voltage at said semiconductor switch output electrode to a first high predetermined threshold voltage.

11. Apparatus according to claim 1 which includes a microprocessor means for generating said write/read signal and said command signal provided to said W/R terminal and said C/stat terminal, respectively, and wherein said microprocessor also monitors the sequence of logic states provided at said C/stat terminal during times (a), (b) and (c) for determining the existence of any of at least three different types of fault conditions for operation of said semiconductor switch/load.

12. Apparatus according to claim 11 wherein said at least three different types of fault conditions correspond to a load shorted high condition, a load shorted low condition and a load open circuit condition.

13. Load driver system with fault detection apparatus, comprising:
   semiconductor switch having a control electrode for receiving a switch control signal which determines on and off modes of operation of the switch, said switch having an output electrode;
   a load coupled to said semiconductor switch output electrode;
   W/R terminal for receiving a write/read control signal;
   C/stat terminal for receiving a command signal;
   circuit means coupled between said semiconductor switch and said W/R and C/stat terminals for providing said switch control signal to said semiconductor switch in accordance with said write/read signal and said command signal; and
   fault diagnostic circuit means coupled to said semiconductor switch and at least one of said W/R and C/stat terminals for monitoring operation of said semiconductor switch and said load and for providing, at said one terminal, a timed sequence of at least three predetermined logic states indicative of said monitored switch/load operation, each of said predetermined logic states indicative of, respectively, switch/load operation at sequential times (a) after said switch control signal attempts to turn said switch on and when said switch is supposed to be on, (b) at a first time after said switch control signal attempts to turn said semiconductor switch off, and (c) at a second time when said switch is supposed to be off, later than said first time, after said switch control signal attempts to turn said semiconductor switch off, a particular sequence of said three logic states indicating proper switch/load operation and each of three other sequences of said three logic states indicative of a different operational fault of said switch/load.

14. System according to claim 13 wherein said circuit means includes a latch means for responding to said write/read signal and said command signal 15. System according to claim 13 wherein said load comprises an inductive load.

16. System according to claim 15 wherein said fault diagnostic means includes fault detector means for providing said sequence of three logic states at said C/stat terminal by monitoring current through said switch and voltage at said switch output electrode.

17. System according to claim 16 wherein said fault detector means includes a load shorted high detector for providing as one of said logic three logic states a S.C. high fault logic state at said C/stat terminal in response to detecting, during said time (a), excessive current through said semiconductor switch after said semiconductor switch receives a switch on logic state signal at its control electrode and prior to said semiconductor switch receiving a switch off logic state signal at its control electrode.

18. System according to claim 16 wherein said fault detector means includes a flyback voltage detector for determining said predetermined logic state at said C/stat terminal during said time (b) in response to comparing voltage at said semiconductor switch output electrode provided by inductive flyback from said load to a first high predetermined threshold voltage.

19. System according to claim 18 which includes a microprocessor means for generating said write/read signal and said command signal provided to said W/R terminal and said C/stat terminal, respectively, and wherein said microprocessor also monitors the sequence of logic states provided at said C/stat terminal during times (a), (b) and (c) for determining the existence of any of at least three different types of fault conditions for operation of said semiconductor switch/load.

20. System according to claim 19 wherein said at least three different types of fault conditions correspond to a load shorted high condition, a load shorted low condition and a load open circuit condition.

21. Load driver system with fault detection apparatus, comprising:

a plurality of semiconductor switches each having a control electrode for receiving a switch control signal which determines on and off modes of operation of the switch, each of said switches having an output electrode;

a load associated with and coupled to each of said semiconductor switch output electrodes, respectively;

W/R terminal for receiving a write/read control signal;

a plurality of C/stat terminals each associated with one of said switches, respectively, and each receiving a command signal;

a plurality of circuit means each coupled between said W/R terminal, one of said semiconductor switches and one of said C/stat terminals, respectively, for providing said switch control signal to said one of said semiconductor switches in accordance with said write/read control signal and said command signal provided at said one of said C/stat terminals associated with said one of said semiconductor switches; and a plurality of fault diagnostic circuit means each coupled to and associated with one of said semiconductor switches and each coupled to at least one of said W/R and C/stat terminals associated with said one of said semiconductor switches for monitoring operation of said one of said semiconductor switches and its associated load and for providing, at said one of said W/R and C/stat terminals associated with said one of said switches, a timed sequence of at least three predetermined logic states indicative of said monitored switch/load operation, each of said predetermined logic states indicative of, respectively, switch/load operation at sequential times (a) after said switch control signal attempts to turn said one of said switches on and when said one of said switches is supposed to be on, (b) at a first time after said switch control signal attempts to turn said one of said semiconductor switches off, and (c) at a second time when said one of said switch is supposed to be off, later than said first time, after said switch control signal attempts to turn said one of said semiconductor switches off, a particular sequence of said three logic states indicating proper switch/load operation and each of three other sequences of said three logic states indicative of a different operational fault of said switch/load, whereby said write/read signal is coupled to a plurality of said switches to control the operation thereof and whereby each of said fault diagnostic circuit means monitors the operation of its associated switch and load.

22. System according to claim 21 which includes a microprocessor means for generating said write/read signal provided to said W/R terminal and said plurality of command signals provided to said plurality of said C/stat terminals, and wherein said microprocessor means also monitors the sequence of logic states provided at said plurality of said C/stat terminals during times (a), (b) and (c) for determining the existence of any of at least three different types of fault conditions for operation of each of said semiconductor switch/loads.

23. System according to claim 22 wherein said at least three different types of fault conditions correspond to a load shorted high condition, a load shorted low condition and a load open circuit condition.

* * * * *